(12) United States Patent
Meyers et al.

(10) Patent No.: US 9,776,586 B2
(45) Date of Patent: Oct. 3, 2017

(54) DEFORMABLE ATTACHMENT FOR ELECTRICAL COMPONENTS

(71) Applicant: Toyota Motor Engineering & Manufacturing North America, Inc., Erlanger, KY (US)

(72) Inventors: Gerritt Benjamin Meyers, Ypsilanti, MI (US); John A. Scheick, Ann Arbor, MI (US); Tyler E. Schnug, Northville, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 5 days.

(21) Appl. No.: 14/964,470

(22) Filed: Dec. 9, 2015

(65) Prior Publication Data

US 2017/0166150 A1 Jun. 15, 2017

(51) Int. Cl.
*B60R 21/00* (2006.01)
*B60R 21/01* (2006.01)
*B60R 16/02* (2006.01)
*B62D 25/20* (2006.01)

(52) U.S. Cl.
CPC .............. *B60R 21/01* (2013.01); *B60R 16/02* (2013.01); *B62D 25/20* (2013.01); *B60R 2021/01006* (2013.01); *B60R 2021/01286* (2013.01)

(58) Field of Classification Search
CPC ................................... F16B 1/00; B60R 21/00
USPC .............. 296/187.03, 187.05, 187.01; 403/2; 361/825
See application file for complete search history.

(56) References Cited

U.S. PATENT DOCUMENTS

| 5,803,649 A | * | 9/1998 | Hoogeboom | A61B 17/29 403/109.7 |
| 5,813,649 A | * | 9/1998 | Peterson | B60N 2/42709 248/300 |
| 5,957,526 A | | 9/1999 | Gramer | |
| 6,552,911 B1 | * | 4/2003 | Haupt | B23K 26/28 174/50 |
| 7,510,404 B2 | | 3/2009 | Koyama | |

(Continued)

FOREIGN PATENT DOCUMENTS

CN 102555971 A 7/2012

OTHER PUBLICATIONS

U.S. Appl. No. 15/004,172, filed Jan. 22, 2016.

*Primary Examiner* — Dennis H Pedder
(74) *Attorney, Agent, or Firm* — Christopher G. Darrow; Darrow Mustafa PC

(57) ABSTRACT

An attachment bracket for attaching electrical components is provided in a vehicle. The attachment bracket can have a deformable tab configured to be operatively connected to vehicle structure, such as a floor panel. The deformable tab can include an attachment portion and a connector portion. The attachment portion can have one or more attachment features, such as an aperture, to operatively connect the deformable tab to the vehicle structure. The connector can include different shapes, sizes, and/or configurations to control and/or influence the deformation of the deformable tab under an application of force. The attachment bracket can be used to operatively connect an electrical component to a vehicle structure. For example, the attachment bracket can retain an vehicle airbag ECU to a vehicle floor panel during impacts of the vehicle.

17 Claims, 6 Drawing Sheets

(56) References Cited

U.S. PATENT DOCUMENTS

| | | | |
|---|---|---|---|
| 7,654,864 B2* | 2/2010 | Ishiguro | H05K 5/0204 248/548 |
| 8,338,720 B2* | 12/2012 | Burgi | H05K 5/0073 174/541 |
| 8,437,134 B2 | 5/2013 | Sarginger | |
| 2013/0205560 A1* | 8/2013 | Ghannam | B60R 16/0239 29/426.5 |

* cited by examiner

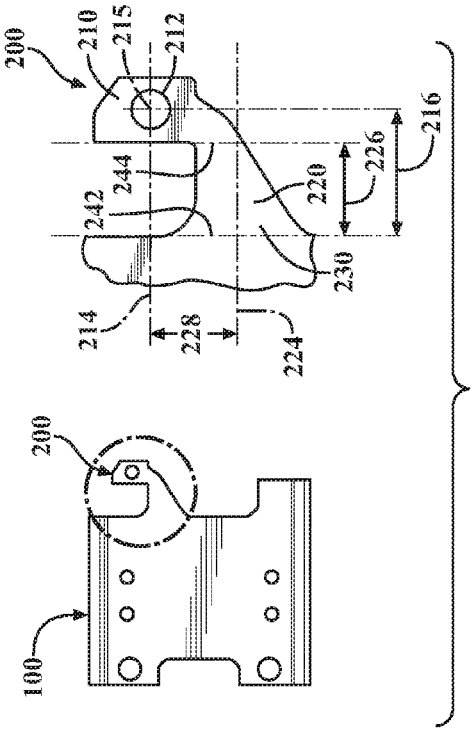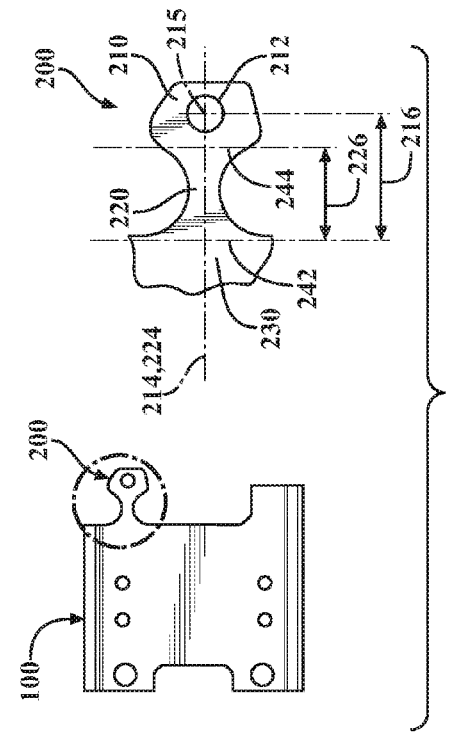
FIG. 3A  FIG. 3C
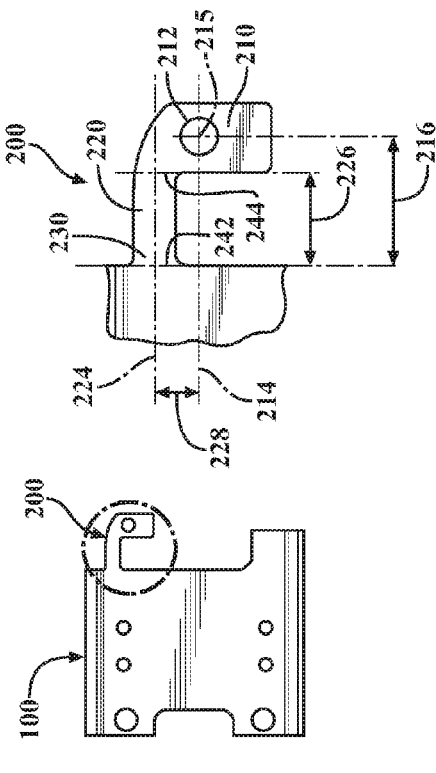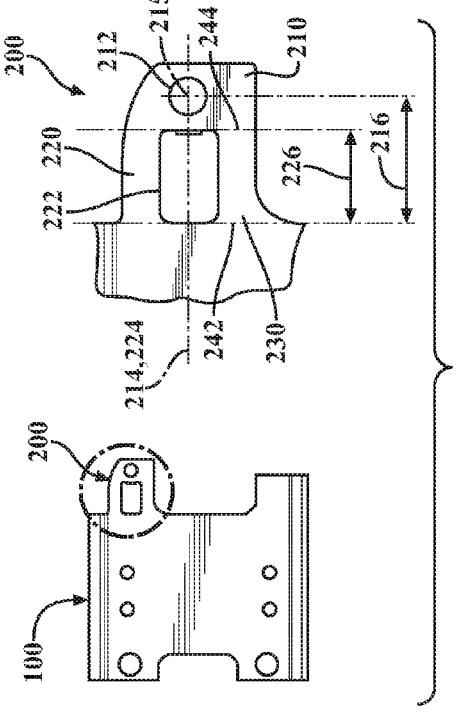
FIG. 3B  FIG. 3D

DEFORMABLE ATTACHMENT FOR ELECTRICAL COMPONENTS

FIELD

The subject matter described herein relates in general to electrical components, and more particularly, to the attachment of electrical components to vehicle structure.

BACKGROUND

Modern vehicles include numerous electrical components to perform various functions. Examples of such electrical components can include electronic circuit boards, electronic control units (ECUs) (e.g., airbag ECUs), event data recorders (EDRs), and computing systems (e.g., entertainment systems, navigation systems). Such electrical components can be attached to a vehicle structure in positions and/or orientations. For example, ECUs can be attached to a vehicle floor panel. During certain situations (e.g., vehicle impacts), the vehicle structure to which an electrical component is attached can deform.

SUMMARY

In one respect, the subject matter described herein is directed to an attachment bracket for an electrical component. The attachment bracket can include a main body configured for operative connection to the electrical component and a vehicle structure. The attachment bracket can further include a deformable tab extending from the main body. The deformable tab can include an attachment portion having at least one attachment feature to allow operative connection of the attachment bracket to the vehicle structure. The attachment portion can be spaced from the main body. The deformable tab can further include a connector portion joining the main body and the attachment portion. The deformable tab can be configured to deform from an initial condition to a deformed condition upon an application of a force to the attachment portion. At least a component of the force can be directed toward the main body.

In another respect, the subject matter described herein is directed to an electrical component system for a vehicle. The system can include a vehicle structure defining an attachment surface and an electrical component. The system can further include an attachment bracket, where the electrical component can be operatively connected to the attachment surface at least in part by the attachment bracket. The attachment bracket can include a main body configured for operative connection to the electrical component and the attachment surface. The attachment bracket can further include a deformable tab extending from the main body. The deformable tab can include an attachment portion having at least one aperture to allow operative connection of the attachment bracket to the attachment surface. The attachment portion can be spaced from the main body. The deformable tab can further include a connector portion joining the main body and the attachment portion. The deformable tab can be configured to deform from an initial condition to a deformed condition upon an application of a force to the attachment portion. At least a component of the force can be directed toward the main body.

In still another respect, the subject matter described herein is directed to an airbag ECU system for a vehicle. The system can include a vehicle floor panel defining an attachment surface and an airbag ECU having an ECU main body and a plurality of attachment tabs. Each of the plurality of attachment tabs can have at least one aperture. The system can further include an attachment bracket operatively connected to the attachment surface and the airbag ECU. The attachment bracket can include a bracket body having at least one main body aperture and an outer surface configured to contact a portion of the ECU body. The attachment bracket can further include a deformable tab extending from the bracket main body. The deformable tab can include an attachment portion having an aperture to allow operative connection of the attachment bracket to the attachment surface, and the attachment portion can be spaced from the main body. The deformable tab can further include a connector portion joining the main body and the attachment portion. The deformable tab can be configured to deform from a substantially planar initial condition to a deformed condition having first and second bend portions upon an application of a force from the vehicle floor to the attachment portion. At least a component of the force can be directed toward the main body.

BRIEF DESCRIPTION OF THE DRAWINGS

FIG. 3A is a view of an attachment bracket with a first example of a deformable tab.

FIG. 3B is a view of an attachment bracket with a second example of a deformable tab.

FIG. 3C is a view of an attachment bracket with a third example of a deformable tab.

FIG. 3D is a view of an attachment bracket with a fourth example of a deformable tab.

DETAILED DESCRIPTION

Figure 1:
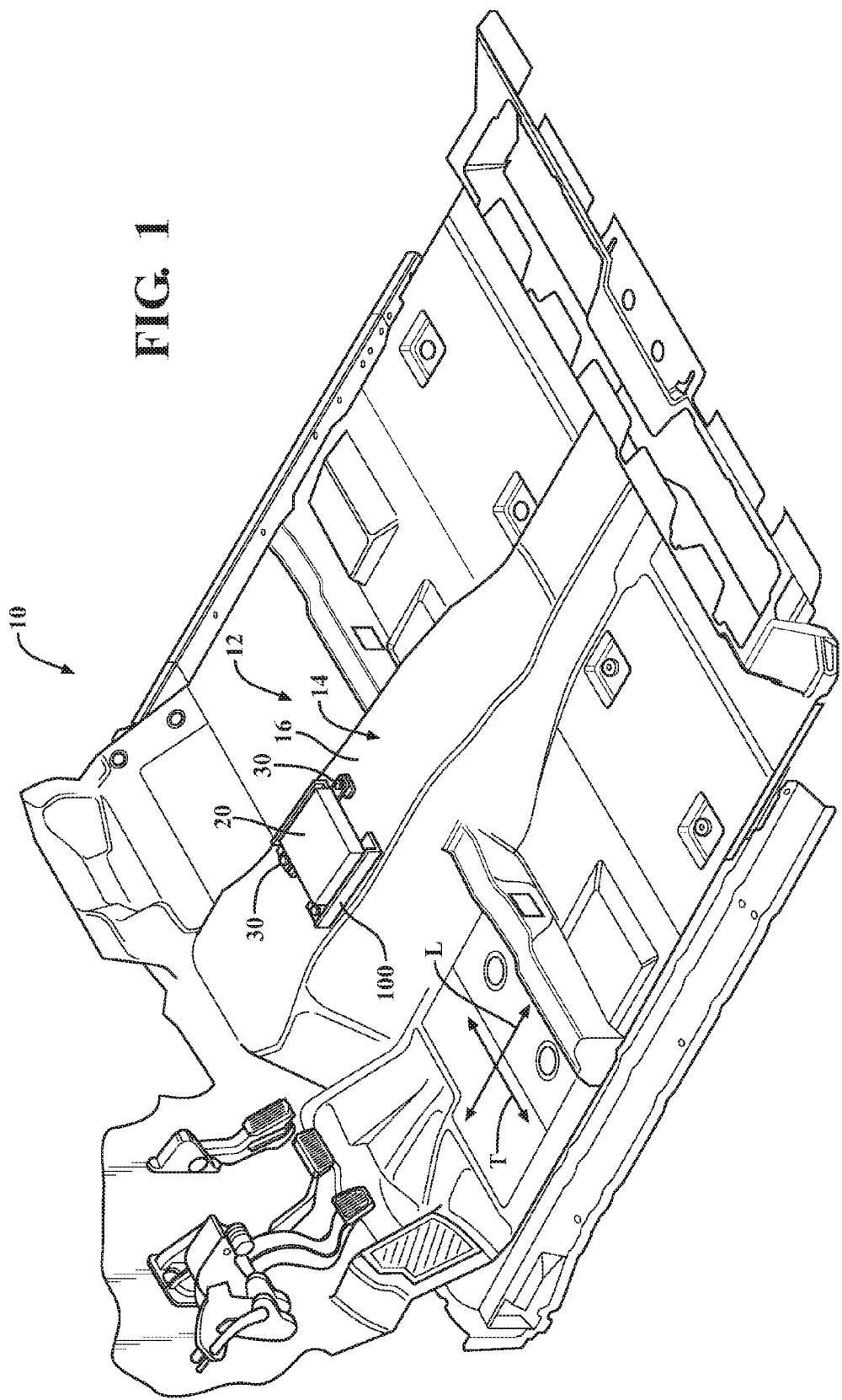
FIG. 1 is an example of a portion of a vehicle showing an electrical component operatively connected to a vehicle structure by an attachment bracket.

This detailed description relates to the attachment of electrical components within a vehicle. This detailed description is more particularly related to attachment brackets that include a deformable tab. The deformable tab can include an attachment portion and a connector. The connector can extend between a main body of the attachment bracket and the attachment portion. The deformable tab can be configured to deform under a force application. In some examples, the deformable tab can include one or more weakened regions. The weakened regions can be configured to control and/or influence the movement of the attachment portion relative to the main body of the attachment bracket. The present detailed description relates to apparatus and/or systems that incorporate one or more of such features. In at least some instances, arrangements described herein can reduce or eliminate conditions in which the electrical component completely detaches from an attachment surface of the vehicle. Further, arrangements can control and/or influence the relative movement and/or rotation of the electrical component when a force is applied.

Detailed embodiments are disclosed herein; however, it is to be understood that the disclosed embodiments are intended only as examples. Therefore, specific structural and functional details disclosed herein are not to be interpreted as limiting, but merely as a basis for the claims and as a representative basis for teaching one skilled in the art to variously employ the aspects herein in virtually any appropriately detailed structure. Further, the terms and phrases used herein are not intended to be limiting but rather to provide an understandable description of possible implementations. Various embodiments are shown in FIGS. 1-6C, but the embodiments are not limited to the illustrated structure or application.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details.

Referring to FIG. 1, an example of a portion of a vehicle 10 is shown. As used herein, "vehicle" means any form of motorized transport. In one or more implementations, the vehicle 10 can be an automobile. While arrangements will be described herein with respect to automobiles, it will be understood that embodiments are not limited to automobiles. In some implementations, the vehicle 10 may be a watercraft, an aircraft, a train, a space craft, or any other form of motorized transport.

The vehicle 10 can define an interior that can be configured to receive one or more vehicle occupants. For example, the interior can be partially defined by a floor panel 12. The floor panel 12 can be configured to extend along a bottom portion of the vehicle 10. The floor panel 12 may be covered by carpeting or other material to improve the aesthetic appearance of the vehicle 10 and/or for other purposes. Further, vehicle components, including, for example, seating, storage compartments, and/or electrical components can be operatively connected to the floor panel 12. The term "operatively connected" as used throughout this description, can include direct or indirect connections, including connections without direct physical contact.

One or more electrical components can be operatively connected to one or more surfaces within the vehicle 10. As used herein, "electrical components" can include components configured to control and/or perform one or more aspects and/or functions of an electrical system of the vehicle 10. FIG. 1 shows one example of an electrical component 20 within the vehicle 10. In one or more arrangements, the electrical component 20 can be a vehicle electronic control unit (ECU) and/or an event data recorder (EDR). For example, the electrical component 20 can be an airbag ECU and/or an airbag EDR. In such arrangements, the electrical component 20 can include an ECU configured to detect and/or evaluate conditions of the vehicle 10 in which one or more airbags should be deployed. In one or more arrangements, the electrical component 20 can be operatively connected to one or more sensors (not shown) to detect information about a condition or property of the vehicle 10, such as speed, acceleration, and/or impact. In one or more arrangements, the electrical component 20 can include an EDR to record data during certain vehicle situations. For example, the EDR can be configured to record information relating to vehicle systems. The EDR can also be configured to record position data of the electrical component 20. For example, the EDR can be configured to record information relating to a location and/or an orientation of the electrical component 20.

Figure 2:
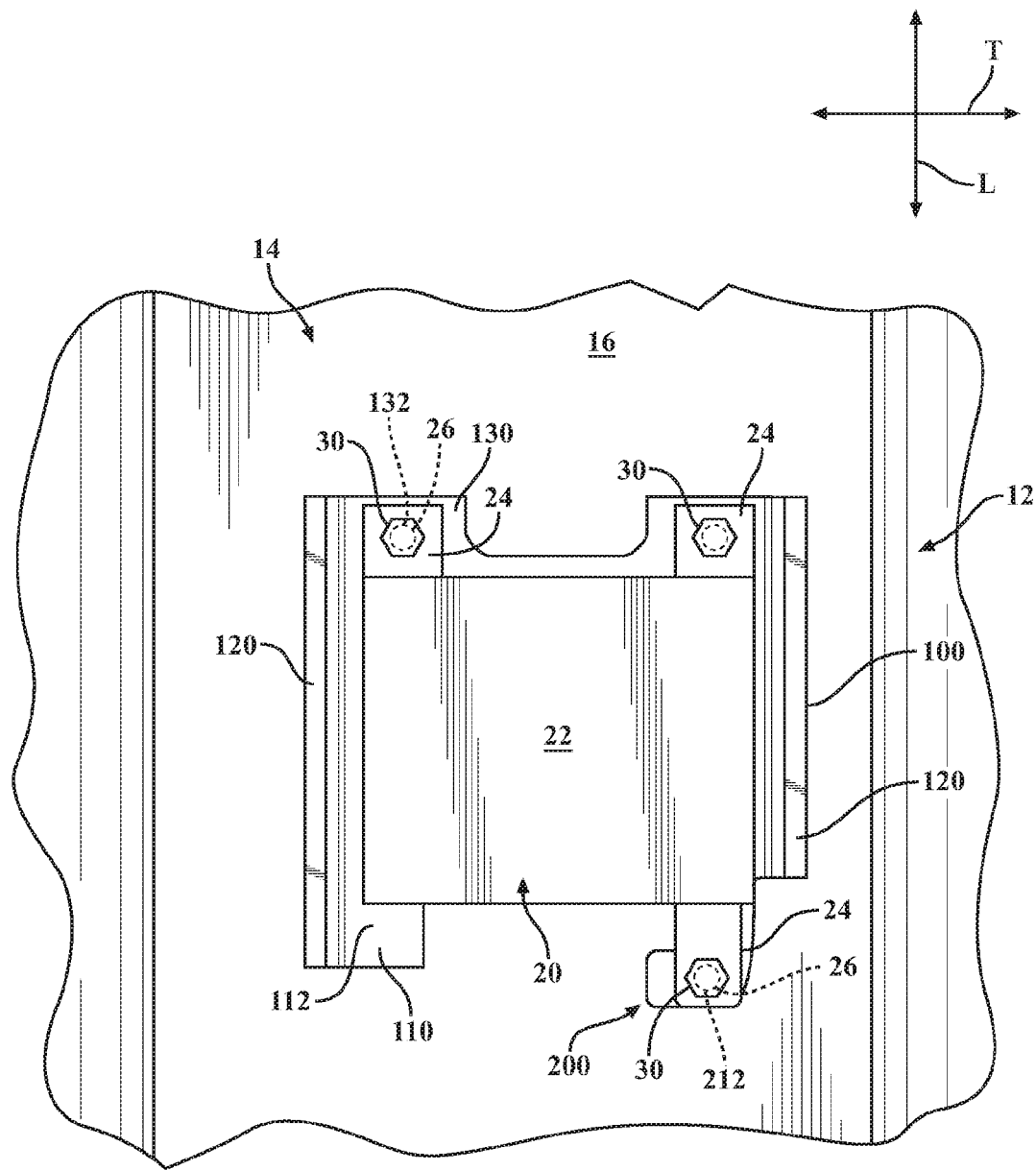
FIG. 2 is a close-up view showing the example electrical component and attachment bracket of FIG. 1.

In one or more arrangements, the electrical component 20 can be operatively connected to one or more vehicle structures, such as the floor panel 12. For instance, the electrical component 20 can be operatively connected to the floor panel 12 at or near a tunnel 14. In one or more arrangements, the tunnel 14 can include an attachment surface 16. In some instances, at least a portion of the attachment surface 16 can be substantially planar. As used herein, the term "substantially" includes exactly the term it modifies and slight variations therefrom. Thus, the term "substantially planar" means exactly planar and slight variations therefrom (e.g., within normal manufacturing tolerances, within about 10% or less, within about 5% or less, etc.). In one or more arrangements, the attachment surface 16 can extend in a longitudinal direction L and a transverse direction T, as shown in FIGS. 1 and 2. In some arrangements, the longitudinal direction L can be substantially parallel to a longitudinal axis of the vehicle (e.g., a fore-aft direction) and the transverse direction T can be substantially parallel to a transverse axis of the vehicle (e.g., a side-to-side direction).

The electrical component 20 can have a body 22. The body 22 can have any suitable size, shape, and/or configuration. The body 22 can form a housing for portions of one or more electrical subcomponents, such as electrical conductors, wiring, circuit boards, processors, and/or memory for one or more ECUs/ and/or EDRs, for example. The body 22 can be any suitable material, including plastics and/or metals.

The electrical component 20 can have one or more attachment features configured to operatively connect the electrical component 20 to the vehicle 10. For example, the electrical component 20 can include one or more attachment tabs 24. The attachment tabs 24 can extend outward from the body 22 as shown in FIG. 2. In one or more arrangements, the attachment tabs 24 can be substantially planar and can extend substantially parallel to each another. In one or more arrangements, one or more of the attachment tabs 24 can include an aperture 26 defined therein. The aperture 26 can be configured to receive a fastener. The fastener can operatively connect the electrical component 20 to the attachment surface 16. For example, the apertures 26 can be configured to receive a bolt 30. The attachment tabs 24 can be formed together with the body 22 as a unitary structure. Alternatively, the attachment tabs 24 can be formed separate from the body 22 and subsequently operatively connected to the body 22. The attachment tabs 24 can be any suitable material, including plastics and/or metals. For example, the attachment tabs 24 can be made of an aluminum alloy.

In one or more arrangements, the electrical component 20 can be operatively connected to the floor panel 12 by an attachment bracket 100. For instance, the attachment bracket 100 can be configured to be positioned between at least a portion of the electrical component 20 and the attachment surface 16, as shown in FIG. 2.

In one or more arrangements, the attachment bracket 100 can include a main body 110. The main body 110 can have any suitable size, shape, and/or configuration. In some instances, at least a portion of the main body 110 can be shaped to substantially match the contour of one or more portions of the attachment surface 16. For example, the main body 110 can include a substantially planar surface.

In one or more arrangements, the main body 110 can include an outer surface 112. The outer surface 112 can face away from the attachment surface 16. The outer surface 112 can be configured to contact at least a portion of the electrical component 20. For example, the electrical component 20 can be operatively connected to the attachment bracket 100 such that a portion of the body 22 of the electrical component 20 directly contacts the outer surface 112.

In one or more arrangements, the attachment bracket 100 can include one or more side walls 120. The one or more side walls 120 can extend away from the main body 110. The one or more side walls 120 can extend in any suitable direction away from the main body 110. For example, as shown in FIGS. 2 and 4A-4C, the attachment bracket 100 can have two side walls 120 on opposing end portions of the main body 110. The side wall(s) 120 can extend at an angle relative to the main body 110. For example, the side wall(s) 120 can extend substantially perpendicular to the main body 110. In some non-limiting examples in which there are two side walls 120, the side walls 120 can be substantially parallel to each other. In one or more arrangements, the side wall(s) 120 can be substantially parallel with the longitudinal axis L.

In one or more arrangements, the main body 110 of the attachment bracket 100 can include an attachment portion 130. The attachment portion 130 can be configured to facilitate the operative connection of the attachment bracket 100 to the electrical component 20 and/or the attachment surface 16. For example, the attachment portion 130 can include one or more apertures 132. The attachment portion 130 can be configured for operative connection to one or more attachment tabs 24 of the electrical component 20. For example, the apertures 132 defined in the attachment portion 130 can be substantially aligned with the apertures 26 defined in the attachment tabs 24. Further, the attachment portion 130 can be configured for operative connection to the attachment surface 16 of the floor panel 12. For example, the apertures 132 can be substantially aligned with apertures defined in the attachment surface 16. In one or more arrangements, a bolt 30 can extend through the aperture 132 and the aperture 26, and at least partially through an aperture in the floor panel 12. The bolt 30 can retain the various structures together in any suitable manner. For instance, the bolt 30 can be configured to threadingly engage the attachment portion 130, the attachment tab 24, and/or the floor panel 12. Alternatively or in addition, the bolt 30 can threadingly engage a threaded nut (not shown) or other retainer element to provide operative connection of the components.

In one or more arrangements, the attachment bracket 100 can include one or more deformable tabs 200. The deformable tab 200 can be configured to deform under certain loading conditions. As used herein, "deform" can include any situations in which the deformable tab 200 rotates, twists, bends, curves, folds, crumples, and/or otherwise changes shape relative to an initial condition. The "initial condition" of the deformable tab 200 means the shape, size, and/or configuration of the deformable tab 200 prior to any deformation. A "deformed condition" can include any shape, size, and/or configuration of the deformable tab 200 subsequent to deformation caused by one or more forces acting on the attachment bracket 100.

The deformable tab 200 can have a variety of different sizes and shapes to provide controlled deformation under applied forces. Some non-limiting examples of initial conditions of the deformable tab 200 are shown in FIGS. 3A-3D. In one or more arrangements, the deformable tab can include an attachment portion 210 configured for operative connection to the electrical component 20 and/or the attachment surface 16. For example, the attachment portion 210 can include one or more apertures 212. In one or more arrangements, the deformable tab 200 can include a connector 220. The connector 220 can extend between and join the main body 110 and the attachment portion 210. In one or more arrangements, the connector 220, the deformable tab 200, and the main body 110 can be formed as a unitary structure. Alternatively, the connector 220, the deformable tab 200, and/or the main body 110 can be formed separately and subsequently joined together in any suitable manner.

In one or more arrangements, the aperture 212 of the attachment portion 210 can be located a distance 216 away from the main body 110. The aperture 212 can have an associated aperture axis 214. The aperture axis 214 be an axis that extends through a center 215 of the aperture 212. In some instances, the attachment bracket 100 can be positioned and/or oriented such that the aperture axis 214 extends substantially parallel to the longitudinal direction L.

The connector 220 can have any suitable size, shape, and/or configuration. For example, the connector 220 can have a length 226, which can be the distance between the main body 110 and the attachment portion 210. The connector 220 can have an associated connector axis 224. The connector axis 224 can extend through a middle portion of the connector 220. In one or more arrangements, the connector axis 224 can define a centerline and/or an axis of symmetry of the connector 220. In one or more arrangements, the connector axis 224 can extend substantially parallel to the aperture axis 214. The connector axis 224 can be offset from the aperture axis 214 by a distance 228, shown in FIGS. 3A and 3B. In some examples, the connector axis 224 can overlay or can be substantially collinear with the aperture axis 214, as shown in FIGS. 3C and 3D. In such instances, the offset distance 228 can be zero or substantially zero. In some examples, the connector 220 can be substantially symmetric about the connector axis 224, such as the example in FIG. 3D. Alternatively, the connector 220 can be asymmetric about the connector axis 224 as shown in FIGS. 3A-3C. In one or more arrangements, the width of the connector 220 can vary along at least a portion of a length of the connector 220 in a direction along the connector axis 224. Alternatively, in one or more arrangements, the width of the connector 220 can be substantially constant along the length of the connector 220.

In one or more arrangements, the deformable tab 200 can be substantially planar in an initial condition. Further, the deformable tab 200 can extend substantially parallel to one or more portions of the main body 110. In one or more arrangements, the deformable tab 200 can be in substantially the same plane as the main body 110. Alternatively or in addition, one or more portions of the deformable tab 200 can extend at an angle relative to the main body 110. For instance, the deformable tab 200 can have one or more bends, curves, and/or steps.

The deformable tab 200 can be configured for controlled deformation upon an application of a force F. "Controlled deformation" means that, when certain forces are applied, the tab can deform at least partially according to a predetermined deformation mode. One example of a controlled deformation is shown in FIGS. 4A-4D. The force F can be applied as a result of one or more conditions. For instance, in one or more arrangements, the force F can be generated during a vehicle collision.

The force F can be any type of force. For instance, the force F can be a compressive force, which can include any force with at least a component that extends in a direction from the attachment portion 210 toward the main body 110. In some arrangements, the force F can be applied to the deformable tab 200 via the floor panel 12. For example, the force F can result from a frontal impact of the vehicle 10. The force F can be applied to the electrical component 20 and the attachment bracket 100 at the bolt 30. FIGS. 4A, 4B, 4C, and 4D show the deformable tab 200 at an initial condition and sequential stages of deformation during an example application of the force F. For instance, the Figures can show different example loading conditions to the attachment bracket 100 over time during a vehicle impact.

Figure 4A:
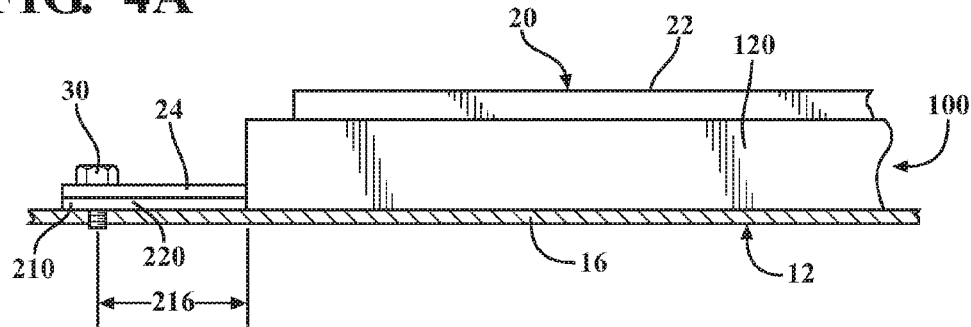
FIG. 4A is a view of an ECU and an attachment bracket, showing an example of an initial condition of a deformable tab.

FIG. 4A shows an example of an initial condition of the deformable tab 200. In some arrangements, FIG. 4A can show the deformable tab 200 before the force F is applied. The center of the aperture 212 of the attachment portion 210 can be located at a distance 216 from an edge of the main body 110.

Figure 4B:
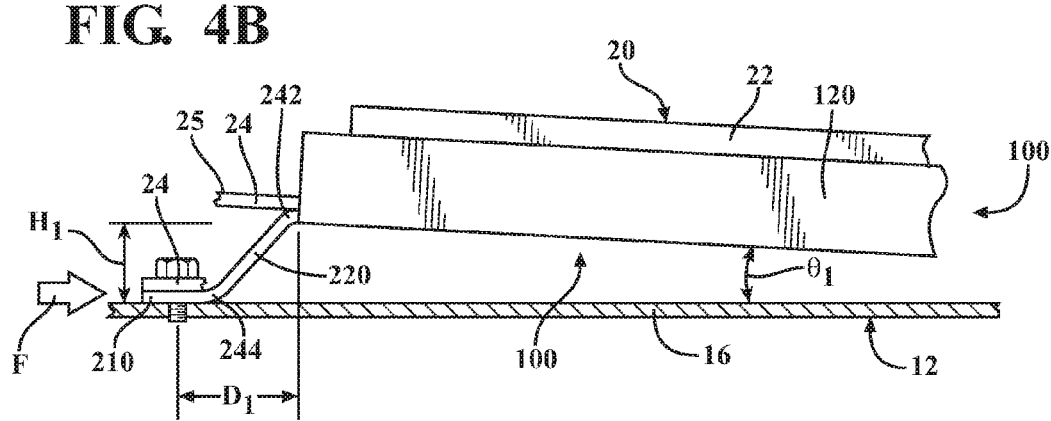
FIG. 4B is a view of the ECU and the attachment bracket of FIG. 4A, showing a first stage of deformation of a deformable tab.

FIG. 4B shows a first stage of deformation as a result of the application of the force F. The attachment tab 24 of the electrical component 20 can crack, break, or otherwise fail at a break 25. For example, the attachment tab 24 can be a brittle material such as an aluminum alloy. In one or more arrangements, the force F can cause the attachment surface 16 of the floor panel 12 to deform. In some instances, the deformation of the attachment surface 16 can cause the attachment portion 210 to move relative to the main body 110 of the attachment bracket 100. For example, the center of the aperture 212 of the attachment portion 210 can be located at a distance $D_1$ from an edge of the main body 110. In one or more arrangements, the relative movement of the attachment portion 210 can cause portions of the deformable tab 200 to bend, rotate, and/or twist.

In one or more arrangements, the deformable tab 200 can be configured to deform at least in part according to a particular deformation mode. To that end, the deformable tab 200 can include one or more weakened regions. For instance, the deformable tab 200 can include a first weakened region 242 and a second weakened region 244. In one or more arrangements, the first and/or second weakened regions 242, 244 can be configured to bend when subjected to a force F. For instance, the deformable tab 200 can bend at the first weakened region 242, and the deformable tab 200 can be configured to bend at a second weakened region 244.

During deformation (e.g., bending) of the deformable tab 200, the main body 110 of the attachment bracket 100 can move relative to an initial position prior to the force F being applied. For example, the first weakened region 242 can be moved a distance $H_1$ from the attachment portion 210 in an upward direction. The term "upward" is used in this respect with respect to the floor panel 12 when the vehicle is upright and the attachment bracket 100 is in an intended position. The term is used merely for convenience to facilitate the description. Therefore, it will be understood that it is not intended to be limiting.

In one or more arrangements, the attachment bracket 100 and the electrical component can be rotated at an angle $\theta_1$ (FIG. 4A) relative to an initial position. For example, as the first weakened region 242 moves in the upward direction, the main body 110 of the attachment bracket 100 can be rotated about the attachment portions 130 at an opposite side of the main body 110 from the deformable tab 200.

Figure 4C:
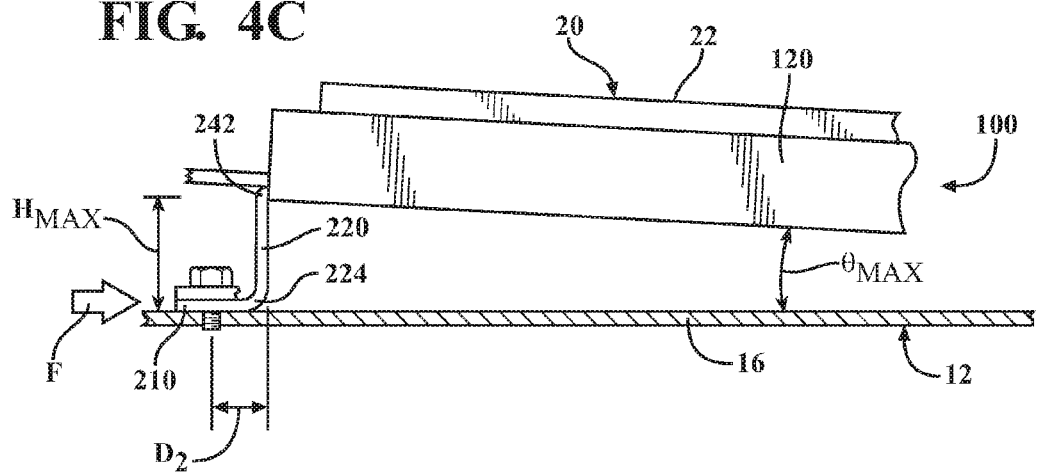
FIG. 4C is a view of the ECU and the attachment bracket of FIG. 4A, showing an example of a second stage of deformation of the deformable tab.

FIG. 4C shows a second stage of deformation as a result of the application of the force F. The second stage can occur subsequent to the first stage. In one or more arrangements, the center of the aperture 212 of the attachment portion 210 can be moved to a distance $D_2$ from an edge of the main body 110. In some arrangements, the deformable tab 200 can continue to bend at the first and second weakened regions 242 and 244 until the main body 110 is displaced a maximum distance upward from the attachment portion 210. For example, the first weakened region 242 can be located a distance $H_{max}$ from the attachment portion 210. Further, the main body 110 can be rotated from the initial position a maximum angle $\theta_{max}$. Thus, configurations of the deformable tab 200 can help to control the maximum relative movement(s) of the electrical component 20.

In one or more arrangements, a maximum relative movement of the electrical component 20 can be established based on a characteristic of the electrical component 20. For example, an airbag ECU and/or an airbag EDR can be configured to provide reliable data up to such degrees of rotational movement. In some arrangements, it can be desirable to have a maximum angle $\theta_{max}$ to be from about 5 to about 8 degrees.

Figure 4D:
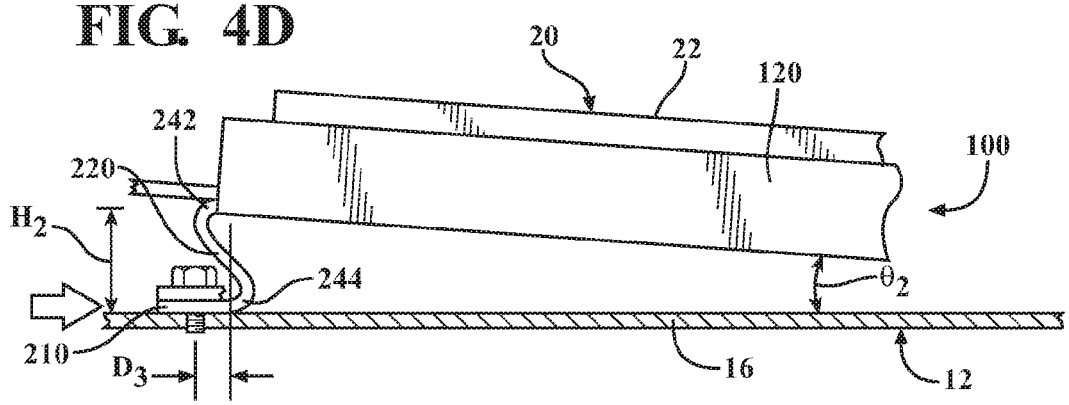
FIG. 4D is a view of the ECU and the attachment bracket of FIG. 4A, showing an example of a third stage of deformation of the deformable tab.

FIG. 4D shows a third and/or a final stage of deformation as a result of the application of the force F. The third stage can occur subsequent to the second stage. The center of the aperture 212 of the attachment portion 210 can be moved to a distance $D_3$ from an edge of the main body 110. The attachment bracket 100 can be moved upward so as to be located at a distance $H_2$ from the attachment portion 210. In some arrangements, the distance $H_2$ is less than $H_{max}$. Further, the main body 110 can be rotated to an angle $\theta_2$ relative to the initial position. In some arrangements, the angle $\theta_2$ is less than $\theta_{max}$.

In one or more arrangements, the deformation of the deformable tab 200 can be influenced and/or controlled by the configuration of the deformable tab 200. For instance, the size and/or shape of the deformable tab 200 can provide certain deformation characteristics. In some arrangements, the first and second weakened regions 242 and 244 can be at least partially controlled and/or influenced by the characteristics of the attachment portion 210 and/or the connector 220. For example, the first weakened region 242 can be located between a first end of the connector 220 and the main body 110. In some instances, the second weakened region 244 can be located between a second end of the connector 220 and the attachment portion 210. In some arrangements, the first and second weakened regions 242 and 244 can include one or more features formed within the deformable tab 200, such as apertures, slots, and/or grooves. As shown in FIG. 3C, the first and second weakened regions 242 and 244 can be located at opposite sides of a connector aperture 222.

In one or more arrangements in which the first and second weakened region 242 and 244 are located near two opposite portions of the connector 220, the length 226 of the connector 220 can influence the movement of the attachment bracket 100 and/or the electrical component 20 during the application of the force F. For example, the length 226 can be substantially equal to the maximum distance $H_{max}$ that the first weakened region 242 can be moved upward relative to the attachment portion 210 during deformation of the deformable tab 200.

Figure 5A:
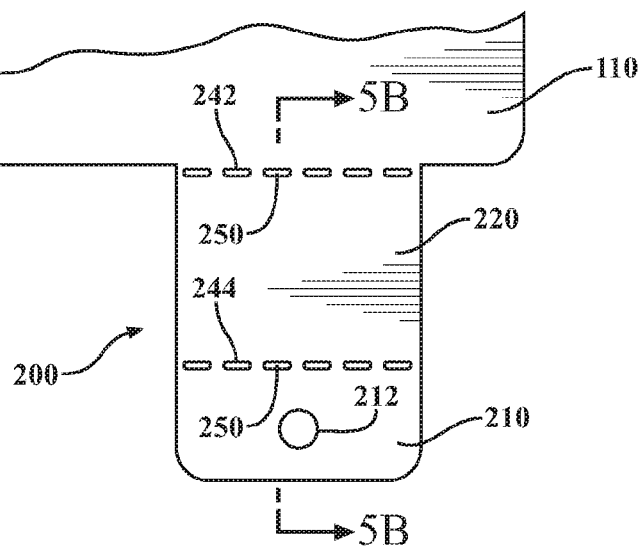
FIG. 5A is a view of a portion of an attachment bracket with a fifth example of a deformable tab.
Figure 5B:
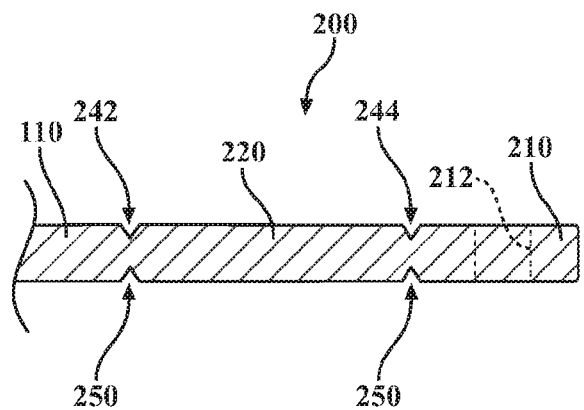
FIG. 5B is a cross-sectional view of the deformable tab of FIG. 5A, viewed along line 5B-5B.

FIGS. 5A and 5B show another example configuration of the deformable tab 200. In one or more arrangements, the first and second weakened regions 242 and 244 can include a plurality of recesses 250. As shown in the cross-sectional view of FIG. 5B, the recesses 250 can be defined in one or more surfaces of the deformable tab 200. The recesses 250 can extend partially through the deformable tab 200. Alternatively or in addition, one or more of the recesses 250 can extend through an entire thickness of the deformable tab 200. The recesses 250 can have any suitable size, shape, and/or configuration. For instance, the recesses 250 can have a substantially v-shaped or u-shaped cross-sectional shape.

The plurality of recesses 250 can be substantially identical to each other. Alternatively, one or more of the recesses 250 can be different from the other recesses 250 in one or more respects. In one or more arrangements, the recesses 250 can be substantially aligned in one or more rows, as is shown in FIG. 5A. Alternatively, one or more recesses 250 can be offset from the other recesses 250. When a plurality of recesses 250 are provided on opposite sides of the deformable tab 200, the recesses 250 on one side can be substantially aligned with the recesses 250 on the opposite side of the deformable tab 200, as is shown in FIG. 5B. Alternatively, the recesses 250 on one side of the deformable tab 200 can be offset from the recesses 250 on the opposite side of the deformable tab 200.

Figure 6A:
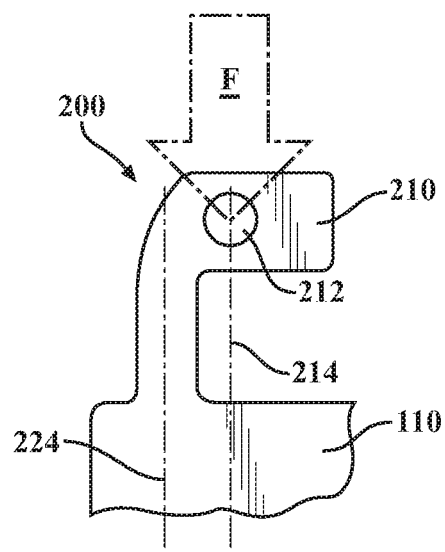
FIG. 6A is a view of a deformable tab, showing an example of a first stage of rotational deformation.
Figure 6B:
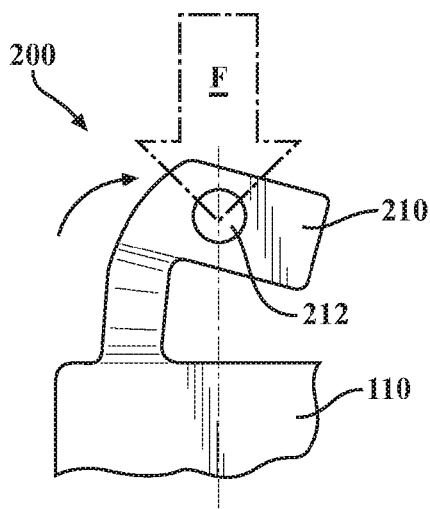
FIG. 6B is a view of the deformable tab of FIG. 6A, showing an example of a second stage of rotational deformation.
Figure 6C:
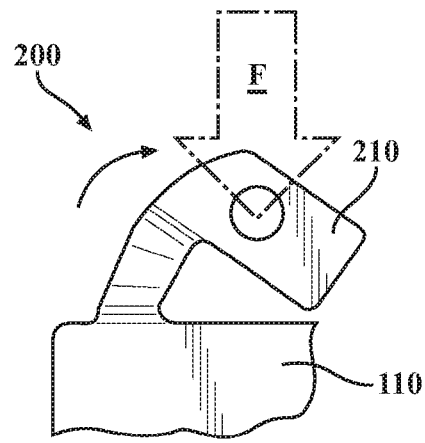
FIG. 6C is a view of the deformable tab of FIG. 6A, showing an example of a third stage of rotational deformation.

Referring now to FIGS. 6A-6C, the attachment portion 210 of the deformable tab 200 can be configured for transverse movement during deformation. "Transverse movement" can include any movement of the attachment portion 210 with a movement component in the transverse direction T. The attachment portion 210 can have a transverse movement away from the connector axis 224 of the initial condition of the deformable tab 200. For example, the attachment portion 210 can have a transverse movement during deformation upon movement in an arcuate or semi-arcuate path toward the main body 110 and away from the connector axis 224 of the initial condition of the deformable tab 200. The transverse movement can include any form of movement, including, for example, rotation, twisting, or bending of the deformable tab 200.

As described above, some configurations of the deformable tab 200 include the aperture axis 214 being offset from the connector axis 224 by a distance 228 (FIGS. 3A and 3B). In some arrangements, the application of the force F at or near the aperture 212 can cause a torque to be applied the deformable tab 200 about an axis substantially perpendicular to the outer surface 112 of the main body 110. As a non-limiting example, FIG. 6A shows an initial condition of the deformable tab 200. The connector 220 can extend away from the main body 110 in a substantially straight direction. The torque resulting from the force F can cause rotation of portions of the deformable tab 200, as shown in FIGS. 6B and 6C.

In one or more arrangements, the deformable tab 200 can be configured to twist during the application of the force F. For instance, the deformable tab 200 can twist about the connector axis 224 as the deformable tab 200 deforms. The deformable tab 200 can be configured to twist, bend, rotate, and/or any combination thereof, between the initial condition and the deformed condition. Further, any combination of forms of deformation can occur simultaneously and/or sequentially in any order.

The attachment bracket 100 can be made of a variety of suitable materials. For example, the attachment bracket 100 can be made of any suitable metal, such as steel. In one or more arrangements, a thickness of the attachment bracket 100 can be substantially constant. In one or more arrangements, the thickness of the attachment bracket 100 can vary in one or more locations such as the deformable tab 200, or the thickness of the attachment bracket 100 can continuously vary across the entire attachment bracket 100 in one or more directions.

The attachment bracket 100 can be made using any suitable process, including, for example, stamping, bending, and/or cutting. In one or more arrangements, the attachment bracket 100 can be formed as a single piece. In one or more arrangements, the attachment bracket 100 can be made of a plurality of separate pieces. The plurality of separate pieces can be joined together in any suitable manner, including, for example, welding, brazing, and/or one or more fasteners.

Now that the various potential systems, devices, elements and/or components of the vehicle 10, the electrical component 20, and the attachment bracket 100 have been described, one manner of connecting the elements will now be described. Various possible steps will now be described. The described steps may be applicable to the arrangements described above in relation to FIGS. 1-6C, but it is understood that the steps can be carried out with other suitable systems and arrangements. Moreover, steps other than those described here can be included, and in fact, arrangements are not limited to including every step described. Further, while a particular chronological order may be described, arrangements described herein are not limited to any particular chronological order.

The electrical component 20, the attachment bracket 100, and the floor panel 12 can be brought together so that at least a portion of the electrical component 20 contacts the outer surface 112 of the main body 110 of the attachment bracket 100. Further, at least a portion of the attachment bracket 100 can contact the attachment surface 16 of the floor panel 12. In one or more arrangements, the apertures 26 in the attachment tabs 24 can be substantially aligned with the apertures 132 in the attachment portion 130. Further, the apertures 26 in the attachment tabs 24 can be substantially aligned with the apertures 212 of the deformable tab 200.

The electrical component 20 and the attachment bracket 100 can be operatively connected to the floor panel 12 of the vehicle using bolts 30 and/or other suitable fasteners. The bolt 30 and/or other fastener can be retainably engaged by threaded engagement with the floor panel 12 or by a retainer element (e.g., a nut).

It will be appreciated that arrangements described herein can provide numerous benefits, including one or more of the benefits mentioned herein. One or more arrangements described herein can provide attachment structure for electrical components that can deform as forces are applied to a mounting surface. For instance, arrangements described herein can include an airbag ECU and/or an airbag EDR operatively connected to a vehicle floor panel. During certain vehicle impacts, the floor panel can deform, collapse, and/or otherwise transfer forces to the ECU/EDR. Arrangements described herein can absorb such forces through deformable attachment tabs. The deformable tabs can deform as forces are applied to the attachment bracket. In some arrangements, the deformable tabs can be configured to have one or more weakened regions. For example, the deformable tabs can include two weakened regions to allow an attachment portion to move relative to a body of the deformable tab. Arrangements described herein can prevent the separation of an electrical component from an attachment surface. Further, arrangements described herein can limit the relative movement and rotation of the electrical component during the application of a force. Arrangements described herein can control and/or influence deformation to maintain the electrical component in a position and/or orientation that allow the electrical component to continue to function properly and/or to maintain accuracy of the electrical component within predetermined specifications.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising (i.e. open language). The phrase "at least one of . . . and . . . " as used herein refers to and encompasses any and all possible combinations of one or more of the associated listed items. As an example, the phrase "at least one of A, B and C" includes A only, B only, C only, or any combination thereof (e.g. AB, AC, BC or ABC).

Aspects herein can be embodied in other forms without departing from the spirit or essential attributes thereof. Accordingly, reference should be made to the following claims, rather than to the foregoing specification, as indicating the scope of the invention.

What is claimed is:

1. An attachment bracket for an electrical component, the electrical component operable within a predetermined angle range relative to an initial orientation, the attachment bracket comprising:
   a main body configured for operative connection to the electrical component and a vehicle structure; and
   a deformable tab extending from the main body, the deformable tab including:
      an attachment portion having at least one attachment feature to allow operative connection of the attachment bracket to the vehicle structure, the attachment portion being spaced from the main body; and
      a connector portion joining the main body and the attachment portion,
   the deformable tab configured to deform from an initial condition to a deformed condition upon an application of a force to the attachment portion, at least a component of the force being directed toward the main body,
   the attachment portion, the connector portion, and the main body being substantially co-planar in the initial condition, and the attachment portion, the connector portion, and the main body being rotated relative to one another in the deformed condition, whereby the electrical component rotates with the main body in the deformed condition,
   the deformable tab being configured to limit rotation of the main body and the electrical component within the predetermined angle range.

2. The attachment bracket of claim 1, wherein the connector portion includes one or more weakened regions.

3. The attachment bracket of claim 2, wherein the one or more weakened regions includes a first weakened region and a second weakened region, wherein the first weakened region is configured to bend as the deformable tab deforms from the initial condition to the deformed condition, and wherein the second weakened region is configured to bend as the deformable tab deforms from the initial condition to the deformed condition.

4. The attachment bracket of claim 3, wherein the first weakened region is located between the connector portion and the main body, and wherein the second weakened region is located between the connector portion and the attachment portion.

5. The attachment bracket of claim 1, wherein, the predetermined angle range includes values up to about 8 degrees relative to the initial orientation.

6. The attachment bracket of claim 4, wherein the first weakened region is configured to move upward from an initial position.

7. The attachment bracket of claim 6, wherein the maximum distance the first weakened region moves upward is substantially equal to a length of the connector portion.

8. The attachment bracket of claim 1, wherein the deformable tab is configured to allow transverse movement of the attachment portion during deformation between the initial condition and the deformed condition.

9. An electrical component system for a vehicle, the system comprising:
   a vehicle structure defining an attachment surface;
   an electrical component operable within a predetermined angle range relative to an initial orientation;
   an attachment bracket, the electrical component being operatively connected to the attachment surface at least in part by the attachment bracket, the attachment bracket including:
      a main body configured for operative connection to the electrical component and the attachment surface; and
      a deformable tab extending from the main body, the deformable tab including:
         an attachment portion having at least one aperture to allow operative connection of the attachment bracket to the attachment surface, the attachment portion being spaced from the main body; and
         a connector portion joining the main body and the attachment portion,
      the deformable tab configured to deform from an initial condition to a deformed condition upon an application of a force to the attachment portion, at least a component of the force being directed toward the main body,
      the attachment portion, the connector portion, and the main body being substantially co-planar in the initial condition, and the attachment portion, the connector portion, and the main body being rotated relative to one another in the deformed condition, whereby the electrical component rotates with the main body in the deformed condition,
   wherein the deformable tab is configured to limit rotation of the main body and the electrical component within the predetermined angle range.

10. The electrical component system of claim 9, wherein:
   the deformable tab is configured to bend at a first bend portion and a second bend portion as the deformable tab deforms from the initial condition to the deformed condition, and
   the first bend portion is located between the connector portion and the main body, and the second bend portion is located between the connector portion and the attachment portion.

11. The electrical component system of claim 10, wherein a distance between the first bend portion and the second bend portion is configured to cause the main body and the electrical component to rotate, the predetermined angle range being about 8 degrees from the initial orientation.

12. The electrical component system of claim 11, wherein the first bend portion is configured to move upward from an initial position.

13. The electrical component system of claim 12, wherein the maximum distance the first bend portion moves upwards is substantially equal to a length of the connector.

14. The electrical component system of claim 9, wherein the electrical component is an airbag ECU.

15. An airbag ECU system for a vehicle, the system comprising:
- a vehicle floor panel defining an attachment surface;
- an airbag ECU having an ECU main body and a plurality of attachment tabs, each of the plurality of attachment tabs having at least one aperture, the airbag ECU being operable within a predetermined angle range relative to an initial orientation;
- an attachment bracket operatively connected to the attachment surface and the airbag ECU, the attachment bracket including:
  - a main body having at least one main body aperture and an outer surface configured to contact a portion of the ECU body; and
  - a deformable tab extending from the main body, the deformable tab including:
    - an attachment portion having an aperture to allow operative connection of the attachment bracket to the attachment surface, the attachment portion being spaced from the main body; and
    - a connector portion joining the main body and the attachment portion,
  - the deformable tab configured to deform from a substantially planar initial condition to a deformed condition having first and second bend portions upon an application of a force from the vehicle floor to the attachment portion, at least a component of the force being directed toward the main body,
  - the attachment portion, the connector portion, and the main body being substantially co-planar in the initial condition, and the attachment portion, the connector portion, and the main body being rotated relative to one another in the deformed condition, whereby the airbag ECU rotates with the main body in the deformed condition,
  - wherein the first and second bend portions of the deformable tab are configured to limit rotation of the main body and the electrical component within the predetermined angle range.

16. The airbag ECU system of claim 15, wherein the attachment bracket is operatively connected to the airbag ECU and the attachment surface via at least one fastener, each of the at least one fasteners configured to extend at least partially through the main body aperture and the aperture defined in the attachment tab of the airbag ECU.

17. The airbag ECU system of claim 15, wherein the first bend portion is located between the connector portion and the main body, and the second bend portion is located between the connector portion and the attachment portion,
the first bend portion is configured to move upwards from the initial position of the deformable tab such that the main body of the attachment bracket and the airbag ECU rotates within the predetermined angle range, the predetermined angle range being about 8 degrees from the initial orientation.

* * * * *